US012368027B2

United States Patent
Orui et al.

(10) Patent No.: US 12,368,027 B2
(45) Date of Patent: Jul. 22, 2025

(54) SUBSTRATE PROCESSING METHOD AND SUBSTRATE PROCESSING APPARATUS

(71) Applicant: Tokyo Electron Limited, Tokyo (JP)

(72) Inventors: Takatoshi Orui, Miyagi (JP); Ryutaro Suda, Miyagi (JP); Yoshihide Kihara, Miyagi (JP); Maju Tomura, Miyagi (JP); Kae Kumagai, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 253 days.

(21) Appl. No.: 17/736,009

(22) Filed: May 3, 2022

(65) Prior Publication Data

US 2022/0359167 A1   Nov. 10, 2022

(30) Foreign Application Priority Data

May 7, 2021   (JP) ................................ 2021-078924

(51) Int. Cl.
*H01J 37/32* (2006.01)

(52) U.S. Cl.
CPC .. *H01J 37/32568* (2013.01); *H01J 37/32449* (2013.01); *H01J 37/32082* (2013.01); *H01J 2237/2007* (2013.01); *H01J 2237/334* (2013.01)

(58) Field of Classification Search
None
See application file for complete search history.

(56) References Cited

U.S. PATENT DOCUMENTS

| 5,888,414 | A | * | 3/1999 | Collins | H01J 37/32165 257/E21.252 |
| 8,932,947 | B1 | * | 1/2015 | Han | H01L 21/3065 438/719 |
| 2004/0175950 | A1 | * | 9/2004 | Puppo | H01L 21/28044 257/E21.198 |
| 2007/0059938 | A1 | * | 3/2007 | Kida | H01J 37/32935 257/E21.252 |
| 2007/0117399 | A1 | * | 5/2007 | Del Puppo | H01L 21/32137 438/253 |
| 2007/0190792 | A1 | * | 8/2007 | Cook | H01L 21/31116 257/E21.252 |
| 2010/0178770 | A1 | * | 7/2010 | Zin | H01L 21/31116 438/694 |
| 2010/0248488 | A1 | * | 9/2010 | Agarwal | H01J 37/32706 438/714 |

(Continued)

FOREIGN PATENT DOCUMENTS

| JP | 2016-039309 A | 3/2016 |
| JP | 2017-085161 A | 5/2017 |

(Continued)

*Primary Examiner* — Allan W. Olsen (74) *Attorney, Agent, or Firm* — Procopio, Cory, Hargreaves & Savitch LLP (57) ABSTRACT

A substrate processing method comprising: providing a substrate having a silicon-containing dielectric film in the substrate support; and generating plasma from a processing gas including a hydrogen- and fluorine-containing gas to etch the silicon-containing dielectric film, wherein the etching step comprises supplying the processing gas into the chamber, supplying a first radio-frequency signal for generating the plasma to the substrate support or the upper electrode, and supplying a first electrical bias to the upper electrode.

15 Claims, 7 Drawing Sheets

(56) References Cited

U.S. PATENT DOCUMENTS

| | | | |
|---|---|---|---|
| 2011/0031216 A1* | 2/2011 | Liao | H01L 21/31116 |
| | | | 216/67 |
| 2017/0256463 A1 | 9/2017 | Bailey et al. | |
| 2019/0326102 A1* | 10/2019 | Mitsumori | H01L 21/31116 |
| 2019/0326103 A1* | 10/2019 | Igarashi | H01J 37/32568 |
| 2020/0243303 A1 | 7/2020 | Mishra et al. | |
| 2021/0082709 A1 | 3/2021 | Tomura et al. | |
| 2022/0051899 A1* | 2/2022 | Suda | H01L 21/3065 |
| 2023/0127467 A1* | 4/2023 | Takahashi | H01L 21/31116 |
| | | | 438/706 |
| 2023/0197458 A1* | 6/2023 | Yokoyama | H01L 21/32137 |
| | | | 438/719 |
| 2023/0230844 A1* | 7/2023 | Tomura | H01J 37/32816 |
| | | | 216/67 |

FOREIGN PATENT DOCUMENTS

| | | |
|---|---|---|
| JP | 2017-195365 A | 10/2017 |
| JP | 2017-228690 A | 12/2017 |
| WO | 2019/17830 A1 | 9/2019 |
| WO | 2019/235398 A1 | 12/2019 |

* cited by examiner

SUBSTRATE PROCESSING METHOD AND SUBSTRATE PROCESSING APPARATUS

BACKGROUND

Exemplary embodiments of the present disclosure relate to a substrate processing method and a substrate processing apparatus.

RELATED ART

Plasma etching of silicon-containing films on substrates is performed in the manufacture of electronic devices. Patent Document 1, for example, discloses a method for etching a dielectric film using plasma etching.

CITATION LIST

Patent Literature

[Patent Document 1] JP 2016-039309 A

SUMMARY

An exemplary embodiment of the present disclosure is a substrate processing method for processing a substrate with a plasma processing apparatus, the plasma processing apparatus including a chamber, a substrate support disposed in the chamber, and an upper electrode disposed in the chamber facing the substrate support; the substrate processing method includes providing a substrate having a silicon-containing dielectric film on the substrate support, and a step of generating plasma from a processing gas including a hydrogen- and fluorine-containing gas to etch the silicon-containing dielectric film, wherein the etching step includes supplying the processing gas into the chamber, supplying a first radio-frequency signal for generating the plasma to the substrate support or the upper electrode, and supplying a first electrical bias to the upper electrode.

DETAILED DESCRIPTION

Embodiments of the present disclosure will now be described.

In an exemplary embodiment, a substrate processing method is provided.

The substrate processing method is a substrate processing method for processing a substrate with a plasma processing apparatus, the plasma processing apparatus including a chamber, a substrate support disposed in the chamber, and an upper electrode disposed in the chamber facing the substrate support, the substrate processing method comprising: providing a substrate having a silicon-containing dielectric film in the substrate support, and generating plasma from a processing gas including a hydrogen- and fluorine-containing gas to etch the silicon-containing dielectric film, wherein the etching step comprises: supplying the processing gas into the chamber, supplying a first radio-frequency signal for generating the plasma to the substrate support or the upper electrode, and supplying a first electrical bias to the upper electrode.

In an exemplary embodiment, the first electrical bias is direct current voltage or a low-frequency RF signal.

In an exemplary embodiment, the first electrical bias is negative direct current voltage.

In an exemplary embodiment, the first electrical bias is a pulse wave or a continuous wave.

In an exemplary embodiment, the first electrical bias is supplied to the upper electrode during a first period and a second period alternating with the first period, the absolute value of the voltage of the first electrical bias in the first period is 0 or a first voltage value, and the absolute value of the voltage of the first electrical bias in the second period is a second voltage value greater than the first voltage value.

In an exemplary embodiment, the first radio-frequency signal is supplied in a third period and a fourth period alternating with the third period, the absolute value of the voltage in the third period is 0 or a third voltage value, the absolute value of the voltage in the fourth period is a second voltage value greater than the third voltage value, and the second period and the third period overlap at least partially.

In an exemplary embodiment, the proportion of the second period relative to the total of the first period and the second period is 20% or more and 80% or less.

In an exemplary embodiment, the frequency that defines the period of the second period relative to the first period and the second period is 2 kHz or more and 8 kHz or less.

In an exemplary embodiment, the etching step further comprises supplying a second electrical bias to the substrate support.

In an exemplary embodiment, the hydrogen- and fluorine-containing gas is hydrogen fluoride gas.

In an exemplary embodiment, the processing gas also includes a phosphorus-containing gas.

In an exemplary embodiment, the phosphorus-containing gas includes a phosphorus halide.

In an exemplary embodiment, the phosphorus halide is phosphorus fluoride.

In an exemplary embodiment, the processing gas also includes at least one carbon-containing gas selected from the group consisting of fluorocarbon gases and hydrofluorocarbon gases.

In an exemplary embodiment, the silicon-containing dielectric film includes at least one selected from the group consisting of a silicon oxide film, a silicon nitride film, and a polycrystalline silicon film.

In an exemplary embodiment, a substrate processing apparatus that processes substrates is provided. The substrate processing apparatus is a substrate processing apparatus for processing a substrate, the plasma processing apparatus comprising: a chamber; a substrate support disposed in the chamber; an upper electrode disposed in the chamber facing the substrate support; a gas supply that supplies processing gas to the chamber; a power supply that supplies power to generate plasma in the chamber; and a control unit, wherein the control unit executes controls to place a substrate having a silicon-containing dielectric film on the substrate support, supply a processing gas including a hydrogen- and fluorine-containing gas to the chamber, supply a first radio-frequency signal for generating the plasma to the substrate support or the upper electrode, and apply a first electrical bias to the upper electrode.

The following is a detailed description of embodiments of the present disclosure with reference to the drawings. In the drawings, identical or similar elements are denoted by the same reference numbers and redundant descriptions of these elements has been omitted. In the following description, positional relationships such as up, down, left and right are based on the positional relationships shown in the drawings except where otherwise specified. The dimensional ratios in the drawings do not indicate actual ratios, and the actual ratios are not limited to the ratios shown in the drawings.

(Configuration of Substrate Processing Apparatus 1)

Figure 1:
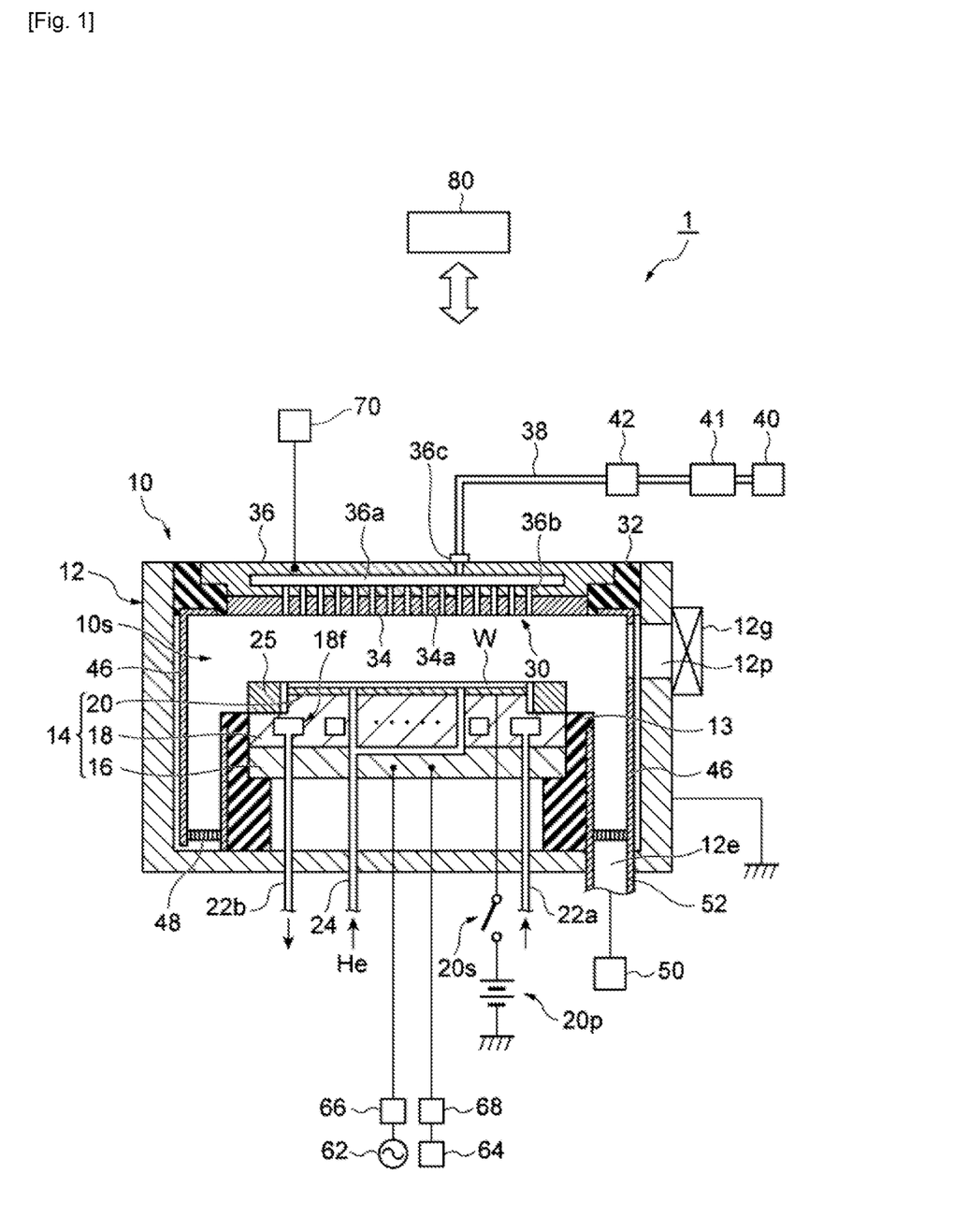
FIG. 1 is a figure schematically illustrating a substrate processing apparatus 1 in an exemplary embodiment of the disclosure.

FIG. 1 is a figure schematically illustrating a substrate processing apparatus 1 in an exemplary embodiment of the disclosure. The substrate processing apparatus 1 is an example of a plasma processing apparatus. The substrate processing method in an exemplary embodiment (referred to below as "the present processing method") may be executed by this substrate processing apparatus 1.

The substrate processing apparatus 1 shown in FIG. 1 includes a chamber 10. The chamber 10 provides an interior space 10s. The chamber 10 includes a chamber body 12. The chamber body 12 has a substantially cylindrical shape. The chamber body 12 may be made of, for example, aluminum. A corrosion-resistant film is provided on the surface of the inner wall of the chamber body 12. The corrosion-resistant film may be made of a ceramic such as aluminum oxide or yttrium oxide.

A passage 12p is formed in the side wall of the chamber body 12. Substrates W are transported between the internal space 10s and the exterior of the chamber 10 via the passage 12p. The passage 12p is opened and closed by a gate valve 12g. The gate valve 12g is provided along the side wall of the chamber body 12.

A support 13 is provided on the bottom of the chamber body 12. This support 13 is made of an insulating material. The support 13 has a substantially cylindrical shape. The support 13 extends upward from the bottom of the chamber body 12 in the internal space 10s. The support 13 supports a substrate support 14. The substrate support 14 is configured to support a substrate W in the internal space 10s.

The substrate support 14 has a lower electrode 18 and an electrostatic chuck 20. The substrate support 14 may also include an electrode plate 16. The electrode plate 16 is made of a conductor such as aluminum and has a substantially disk shape. A lower electrode 18 is provided on the electrode plate 16. The lower electrode 18 is made of a conductor such as aluminum and has a substantially disk shape. The lower electrode 18 is connected electrically to the electrode plate 16.

An electrostatic chuck 20 is provided on the lower electrode 18. A substrate W is placed on the upper surface of the electrostatic chuck 20. The electrostatic chuck 20 has a main body and electrodes. The main body of the electrostatic chuck 20 is substantially disk shaped and is made of a dielectric material. The electrodes for the electrostatic chuck 20 are film-like electrodes, and are disposed in the main body of the electrostatic chuck 20. The electrodes of the electrostatic chuck 20 are connected to a direct current power supply 20p via a switch 20s. When voltage from the direct current power supply 20p is applied to the electrodes of the electrostatic chuck 20, an electrostatic attractive force is generated between the electrostatic chuck 20 and the substrate W. A substrate W is attracted to the electrostatic chuck 20 by electrostatic attraction and is held in place by the electrostatic chuck 20.

An edge ring 25 is arranged on the substrate support 14. The edge ring 25 is a ring-shaped member. The edge ring 25 may be made of, for example, silicon, silicon carbide, or quartz. A substrate W is placed on the electrostatic chuck 20 in the region surrounded by the edge ring 25.

A flow path 18f is disposed in the lower electrode 18. A heat exchange medium (for example, a refrigerant) is supplied to the flow path 18f from a chiller provided outside of the chamber 10 via a pipe 22a. The heat exchange medium supplied to the flow path 18f is returned to the chiller via the pipe 22b. In the substrate processing apparatus 1, the temperature of the substrate W placed on the electrostatic chuck 20 is adjusted by heat exchange between the heat exchange medium and the lower electrode 18.

The substrate processing apparatus 1 is provided with a gas supply line 24. The gas supply line 24 supplies heat transfer gas (for example, He gas) from a heat transfer gas supply mechanism to the gap between the upper surface of the electrostatic chuck 20 and the rear surface of the substrate W.

The substrate processing apparatus 1 also includes an upper electrode 30. The upper electrode 30 is provided above the substrate support 14. The upper electrode 30 is supported on the upper portion of the chamber body 12 via a member 32. The member 32 is made of nine insulating materials. The upper electrode 30 and the member 32 close the upper opening in the chamber body 12.

The upper electrode 30 may include a top plate 34 and a support 36. The lower surface of the top plate 34 is the lower surface on the internal space 10s side, and defines the internal space 10s. The top plate 34 may be made of a low-resistance conductor or semiconductor that generates less Joule heat. The top plate 34 has a plurality of gas discharge holes 34a that pass through the top plate 34 in the thickness direction of the plate.

The support 36 detachably supports the top plate 34. The support 36 is made of a conductive material such as aluminum. A gas diffusion chamber 36a is disposed in the support 36. The support 36 has a plurality of gas holes 36b extending downward from the gas diffusion chamber 36a. The gas holes 36b communicate with the gas discharge holes 34a. A gas inlet 36c is formed in the support 36. The gas inlet 36c is connected to the gas diffusion chamber 36a. A gas supply pipe 38 is connected to the gas inlet 36c.

A group of gas sources 40 is connected to the gas supply pipe 38 via a group of flow rate controllers 41 and a group of valves 42. The group of flow rate controllers 41 and the group of valves 42 constitute a gas supply. The gas supply may also include the group of gas sources 40. The group of gas sources 40 includes a plurality of gas sources. The plurality of gas sources include the sources of the processing gases used in the processing method. The group of flow rate controllers 41 includes a plurality of flow rate controllers. Each of the plurality of flow rate controllers in the group of flow rate controllers 41 is a mass flow controller or a pressure control-type flow rate controller. The group of valves 42 includes a plurality of opening and closing valves. Each of the plurality of gas sources in the group of gas sources 40 is connected to the gas supply pipe 38 via a corresponding flow rate controller in the group of flow rate controllers 41 and an opening and closing valve in the group of valves 42.

In the substrate processing apparatus 1, a shield 46 is detachably provided along the inner wall surface of the chamber body 12 and the outer periphery of the support 13. The shield 46 keeps reaction byproducts from adhering to the chamber body 12. The shield 46 may be configured, for example, by forming a corrosion-resistant film on the surface of a base material made of aluminum. The corrosion resistant film may be made of a ceramic such as yttrium oxide.

A baffle plate 48 is provided between the support 13 and the side wall of the chamber body 12. The baffle plate 48 may be configured, for example, by forming a corrosion-resistant film (a film such as yttrium oxide) on the surface of a member made of aluminum. The baffle plate 48 is formed with a plurality of through holes. An exhaust port 12e is provided below the baffle plate 48 in the bottom portion of the chamber body 12. An exhaust device 50 is connected to the exhaust port 12e via an exhaust pipe 52. The exhaust device 50 includes a pressure-regulating valve and a vacuum pump such as a turbo molecular pump.

The substrate processing apparatus 1 includes a radio-frequency power supply 62 and a bias power supply 64. The radio-frequency power supply 62 is a power supply that generates radio-frequency power HF. The radio-frequency power HF is one example of a first radio-frequency signal. The radio-frequency power HF has a first frequency suitable for plasma generation. The first frequency may be, for example, a frequency in the range of 27 MHz to 100 MHz. The radio-frequency power supply 62 is connected to the lower electrode 18 via a matching box 66 and the electrode plate 16. The matching box 66 has a circuit for matching the impedance on the load side (lower electrode 18 side) of the radio-frequency power supply 62 with the output impedance of the radio-frequency power supply 62. The radio-frequency power supply 62 may be connected to the upper electrode 30 via the matching box 66. The radio-frequency power supply 62 is an example of a plasma generator.

The bias power supply 64 is a power supply that generates an electrical bias. The electrical bias is one example of a second electrical bias. The bias power supply 64 is connected electrically to the lower electrode 18. The electrical bias has a second frequency. The second frequency is lower than the first frequency. The second frequency is, for example, a frequency in the range of 400 kHz to 13.56 MHz. When used in combination with radio-frequency power HF, the electrical bias is applied to the substrate support 14 to attract ions toward the substrate W. In one example, the electrical bias is applied to the lower electrode 18. When an electrical bias is applied to the lower electrode 18, the potential of the substrate W mounted on the substrate support 14 fluctuates within a period defined by the second frequency. The electrical bias may be applied to a bias electrode disposed in the electrostatic chuck 20.

In one embodiment, the electrical bias may be radio-frequency power LF with a second frequency. The radio-frequency power LF is one example of a second electrical bias. When used in combination with radio-frequency power HF, the radio-frequency power LF is used to attract ions toward the substrate W. The bias power supply 64 configured to generate the radio-frequency power LF is connected to the lower electrode 18 via the matching box 68 and the electrode plate 16. The matching box 68 has a circuit for matching the impedance on the load side (lower electrode 18 side) of the bias power supply 64 with the output impedance of the bias power supply 64.

Note that plasma may be generated using radio-frequency power LF alone without radio-frequency power HF, that is, by using only a single source of radio-frequency power. Here, the frequency of radio-frequency power LF may be a frequency higher than 13.56 MHz, such as 40 MHz. Here, the substrate processing apparatus 1 does not require a radio-frequency power supply 62 or a matching box 66. Here, the bias power supply 64 is an example of a plasma generator.

In another embodiment, the electrical bias may be pulsed voltage (pulse voltage). Here, the bias power supply may be a direct current power supply. The bias power supply may be configured so that the power supply itself supplies pulsed voltage, or may be configured to include a device downstream from the bias power supply that pulses the voltage. In one example, the pulse voltage is applied to the lower electrode 18 so that a negative potential is generated in the substrate W. The waveform of the pulse voltage may be rectangular waves, triangular waves, impulses, or some other waveform.

The period of the pulse voltage is defined by the second frequency. The period of the pulse voltage includes two periods. The pulse voltage in one of the two periods is negative voltage. The level (absolute value) of the voltage in one of the two periods is higher than the level of the voltage (absolute value) in the other period. The voltage in the other period may be either negative or positive. The level of the negative voltage in the other period may be zero or greater than zero. In the present embodiment, the bias power supply 64 is connected to the lower electrode 18 via a low-pass filter and an electrode plate 16. The bias power supply 64 may be connected to a bias electrode disposed in the electrostatic chuck 20 instead of to the lower electrode 18.

In one embodiment, the bias power supply 64 may provide continuous waves of electrical bias to the lower electrode 18. In other words, the bias power supply 64 may continuously apply an electrical bias to the lower electrode 18.

In another embodiment, the bias power supply 64 may apply electrical bias pulse waves to the lower electrode 18. The pulse waves of the electrical bias may be periodically applied to the lower electrode 18. The period of the electrical bias pulse waves is defined by a third frequency. The third frequency is lower than the second frequency. The third frequency may be, for example, 1 Hz or more and 200 kHz or less. In another example, the third frequency may be greater than or equal to 5 Hz and less than or equal to 100 kHz.

The period of the electrical bias pulse waves is actually two periods, namely, an H period and an L period. The level of the electrical bias (that is, the level of the pulse of the electrical bias) in the H period is higher than the level of the electrical bias in the L period. In other words, pulse waves of the electrical bias may be applied to the lower electrode 18 by increasing and decreasing the level of the electrical bias. The level of the electrical bias during the L period may be greater than zero. Alternatively, the level of electrical bias during the L period may be zero. In other words, pulse waves of the electrical bias may be applied to the lower electrode 18 by alternately switching on and off the supply of electrical bias to the lower electrode 18. Here, when the electrical bias is radio-frequency power LF, the level of the electrical bias is the power level of radio-frequency power LF. When the electrical bias is radio-frequency power LF, the level of radio-frequency power LF in the pulses of the electrical bias may be 2 kW or more. When the electrical bias is composed of pulse waves of negative direct current voltage, the level of the electrical bias is the effective value of the absolute value of the negative direct current voltage.

The duty ratio of the electrical bias pulse waves, that is, the ratio of the H period in the periods of the electrical bias pulse waves, may be, for example, 1% or more and 80% or less. In another example, the duty ratio of the electrical bias pulse waves may be 5% or more and 50% or less. Alternatively, the duty ratio of the pulse waves of the electrical bias may be 50% or more and 99% or less.

In one embodiment, the radio-frequency power supply 62 may supply continuous waves of radio-frequency power HF. In other words, the radio-frequency power supply 62 may continuously supply radio-frequency power HF.

In another embodiment, the radio-frequency power supply 62 may supply pulse waves of radio-frequency power HF. The pulse waves of radio-frequency power HF may be supplied periodically. The period of the pulse waves of radio-frequency power HF is defined by the fourth frequency. The fourth frequency is lower than the second frequency. In one embodiment, the fourth frequency is the same as the third frequency. The period of radio-frequency power HF pulse waves is actually two periods, namely an H period and an L period. In the two periods, the power level of the radio-frequency power HF in the H period is higher than the power level of the radio-frequency power HF in the L period. The power level of the radio-frequency power HF in the L period may be zero or greater than zero.

The periods of pulse waves of radio-frequency power HF may be synchronized with the periods of pulse waves of electrical bias. The H period in the pulse wave periods of the radio-frequency power HF may be synchronized with the H period of the pulse wave periods of the electrical bias. Alternatively, the H period in the pulse wave periods of the radio-frequency power HF is not synchronized with the H period in the pulse wave periods of the electrical bias. The length of time of the H period in the pulse wave periods of the radio-frequency power HF may be the same as or different from the length of time of the H period in the pulse wave periods of the electrical bias. Some or all of the H period in the radio-frequency power HF pulse wave periods may overlap with the H period in the electrical bias pulse wave periods.

The substrate processing apparatus 1 also includes a power supply 70. The power supply 70 is connected to the upper electrode 30. In one example, the substrate processing apparatus 1 may be configured to supply direct current voltage or low-frequency power to the upper electrode 30 during plasma processing. The direct current voltage and low-frequency power are examples of a first electrical bias. For example, the power supply 70 may supply negative direct current voltage to the upper electrode 30 or may periodically supply low-frequency power. The direct current voltage or low-frequency power may be supplied as pulse waves or continuous waves. In the present embodiment, positive ions in the internal space 10*s* are attracted toward the upper electrode 30 and collide. As a result, secondary electrons are emitted from the upper electrode 30. The emitted secondary electrons modify the mask film MK and improve the etching resistance of the mask film MK. The secondary electrons also help improve plasma density. In addition, because the charged substrate W is neutralized by exposure to secondary electrons, the linearity of ions traveling into the recesses formed by etching is enhanced. When the upper electrode 30 is made of a silicon-containing material, silicon is emitted along with secondary electrons due to collisions with positive ions. The released silicon combines with oxygen in the plasma and is deposited on the mask as a silicon oxide compound, which functions as a protective film. Therefore, by supplying direct current voltage or low-frequency power to the upper electrode 30, the selection ratio is improved, shape abnormalities in the recesses formed by etching are reduced, and the etching rate is improved.

When plasma processing is performed in the substrate processing apparatus 1, gas is supplied from the gas supply unit into the internal space 10*s*. A radio-frequency electric field is also generated between the upper electrode 30 and the lower electrode 18 by supplying radio-frequency power HF and/or an electrical bias. The resulting radio-frequency electric field generates plasma from the gas in the internal space 10*s*.

The substrate processing apparatus 1 may also include a control unit 80. The control unit 80 may be a computer including a processor, a storage unit such as memory, an input device, a display device, and a signal input/output interface. The control unit 80 controls each unit in the substrate processing apparatus 1. The operator can use the input device to issue instructions to the control unit 80 in order to manage the substrate processing apparatus 1. The control unit 80 can also visually display the operational status of the substrate processing apparatus 1 on the display device. Control programs and recipe data are stored in the storage unit. The control program is executed by the processor in order to execute various processes in the substrate processing apparatus 1. The processor executes a control program and controls each unit in the substrate processing apparatus 1 according to the recipe data. In one exemplary embodiment, some or all of the control unit 80 may be provided as a portion of the configuration of a device external to the substrate processing apparatus 1.

(Example of a Substrate W)

Figure 2:
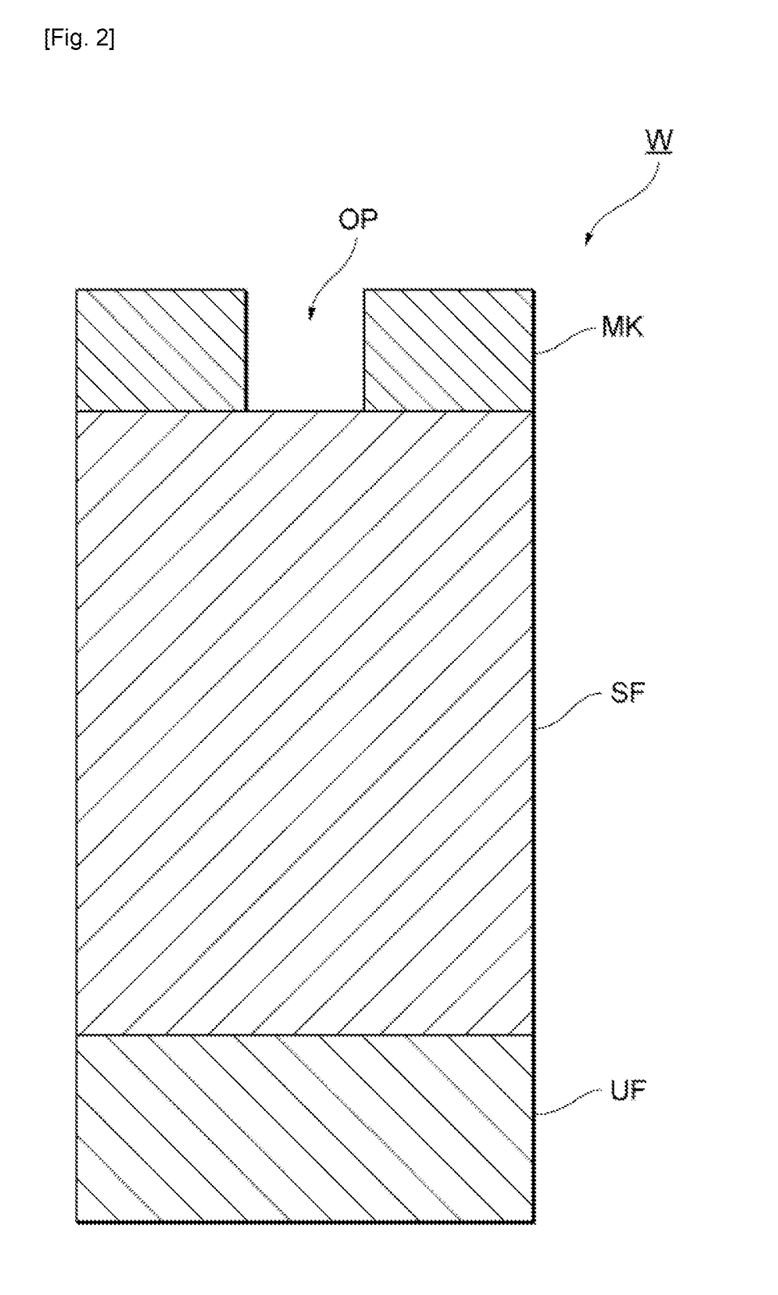
FIG. 2 is a figure showing an example of the cross-sectional structure of a substrate W.
Figure 3:
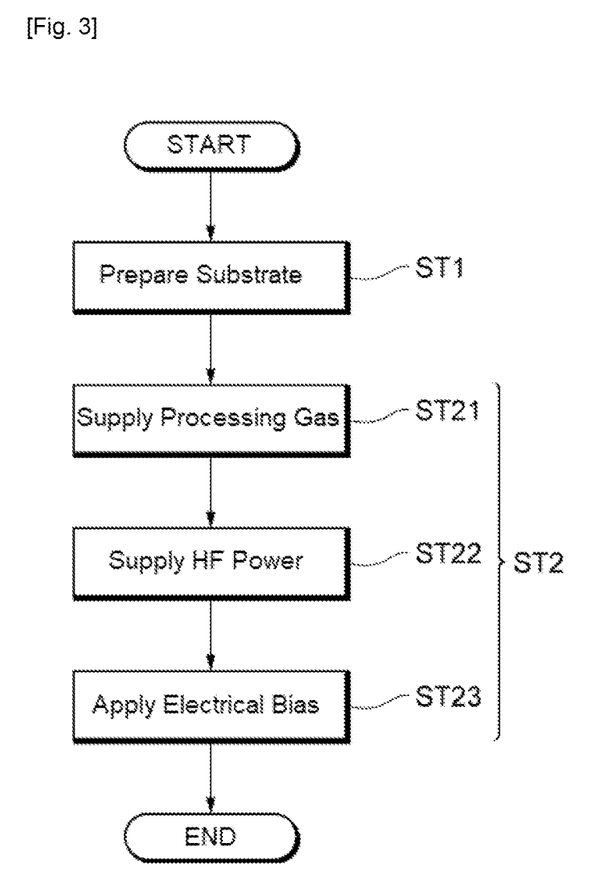
FIG. 3 is a flowchart showing an example of the present processing method.

FIG. 2 is a figure showing an example of the cross-sectional structure of a substrate W. The substrate W is an example of a substrate that may be subjected to the processing method. The substrate W has a silicon-containing film SF that is an example of a dielectric film in this processing method. The substrate W may have an undercoat film UF and a mask film MK. As shown in FIG. 3, the substrate W may be formed by laminating a undercoat film UF, the silicon-containing film SF, and a mask film MK in successive order.

The undercoat film UF may be, for example, an organic film, a dielectric film, a metal film, or a semiconductor film formed on a silicon wafer. The base film UF may also be a silicon wafer. The undercoat film UF may be configured by laminating a plurality of films.

The silicon-containing film SF may be a silicon-containing dielectric film. The silicon-containing dielectric film may be a silicon oxide film or a silicon nitride film. The silicon-containing dielectric film may be another type of film as long as it contains silicon. The silicon-containing film SF may also be a silicon film (such as a polycrystalline silicon film). The silicon-containing film SF may include at least one of a silicon nitride film, a polysilicon film, a carbon-containing silicon film, and a low dielectric constant film. The carbon-containing silicon film may include a SiC film and/or a SiOC film. The low dielectric constant film contains silicon and may be used as an interlayer insulating film. The silicon-containing film SF may include two or more different types of silicon-containing films. The two or more silicon-containing films may include a silicon oxide film and a silicon nitride film. The silicon-containing film SF may be, for example, a multilayer film including one or more alternatingly laminated silicon oxide films and silicon nitride films. The silicon-containing film SF may be a multilayer film including a plurality of alternatingly laminated silicon oxide films and silicon nitride films. Alternatively, the two or more silicon-containing films may include a silicon oxide film and a silicon film. The silicon-containing film SF may be, for example, a multilayer film containing one or more alternatingly laminated silicon oxide films and silicon films. The silicon-containing film SF may be a multilayer film including a plurality of alternatingly laminated silicon oxide films and polycrystalline silicon films. Alternatively, the two or more silicon-containing films may include a silicon oxide film, a silicon nitride film, and a silicon film.

The mask film MK is provided on top of the silicon-containing film SF. The mask film MK is made of a material with an etching rate lower than the etching rate of the silicon-containing film SF in step ST2. The mask film MK may be made of an organic material. In other words, the mask film MK may contain carbon. The mask film MK may be made of, for example, an amorphous carbon film, a photoresist film, or a spin-on carbon film (SOC film). Alternatively, the mask film MK may be made of a silicon-containing film such as a silicon-containing anti-reflective film. Alternatively, the mask film MK may be a metal-containing mask made of a metal-containing material such as titanium nitride, tungsten, or tungsten carbide.

The mask film MK is patterned so as to define at least one opening OP in the silicon-containing film SF. In other words, the mask film MK has a pattern for etching the silicon-containing film SF in the step ST2. A recess such as a hole or a trench is formed in the silicon-containing film SF based on the shape of the opening OP defined by the pattern on the mask film MK. The aspect ratio of the opening formed in the silicon-containing film SF in step ST2 may be 20 or more, 30 or more, 40 or more, or 50 or more. Note that the mask film MK may have a line-and-space pattern.

(Example of the Processing Method)

FIG. 3 is a flowchart showing an example of the present processing method. This processing method may be executed on a substrate W using, for example, the substrate processing apparatus 1 shown in FIG. 1.

Figure 4:
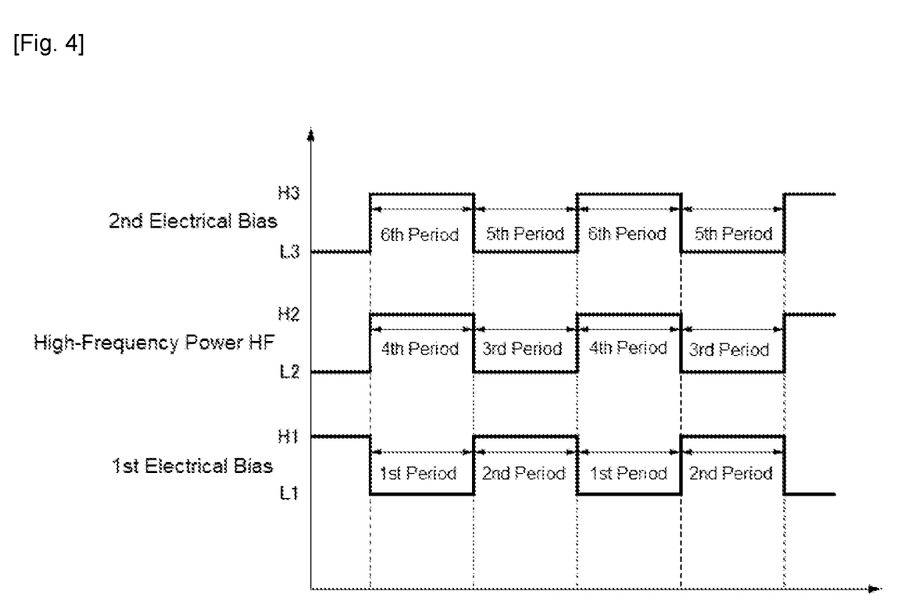
FIG. 4 is a timing chart for a first electrical bias, radio-frequency power HF, and a second electrical bias.

FIG. 4 is a timing chart for the radio-frequency power HF and second electrical bias supplied to the substrate support 14 (lower electrode 18 or bias electrode) and for the first electrical bias applied to the upper electrode 30. In FIG. 4, the horizontal axis indicates time. The vertical axis indicates the voltage levels of the first electrical bias and the second electrical bias (for example, the effective values of the absolute values of the voltages of the electrical biases) and the power level of the radio-frequency power HF (for example, the effective power value of the radio-frequency power HF). Here, the "L1" for the first electrical bias indicates that the first electrical bias is not supplied or is lower than the voltage level indicated by "H1." Also, "L2" for the radio-frequency power HF indicates that radio-frequency power HF is not supplied or is lower than the power level indicated by "H2." In addition, "L3" for the second electrical bias indicates that the second electrical bias is not supplied or is lower than the voltage level indicated by "H3." The voltage levels for L1 and L3 may be zero, and the power level for L2 may be zero.

Note that in FIG. 4 pulse waves are used in the first electrical bias, radio-frequency power HF, and second electrical bias. In one example, the first electrical bias is composed of pulse waves that alternate between a first period with a voltage level of "L1" and a second period with a voltage level of "H1." In other words, the first electrical bias is composed of pulse waves with an electrical pulse in the second period. In another example, the radio-frequency power HF is composed of pulse waves that alternately repeat a third period in which the power level is "L2" and a fourth period in which the power level is "H2." In other words, the radio-frequency power HF is composed of pulse waves having an electric pulse in the fourth period. In another example, the second electrical bias is composed of pulse waves that alternately repeat a fifth period in which the voltage level is "L3" and a sixth period in which the voltage level is "H3." In other words, the second electrical bias is composed of pulse waves having an electrical pulse in the sixth period. In another example, the electric pulse of the first electrical bias (pulse wave) and the second electrical bias (pulse wave) may be composed of pulse-shaped voltage (pulse voltage). The pulse voltage may be composed of rectangular waves, triangular waves, impulses, or some other waveform. The second electrical bias may also be composed of continuous waves. In one example, the second electrical bias may be composed of continuous waves in which the pulse voltage is continuously applied in the fifth and sixth periods. Each waveform in FIG. 4 is illustrated schematically, and does not specifically indicate the frequency, time, power, and voltage, etc.

An example of the processing method shown in FIG. 3 being executed on the substrate W shown in FIG. 2 will now be described with reference to the drawings. In the following example, the control unit 80 shown in FIG. 1 controls each unit in the substrate processing apparatus 1 in order to execute the processing method.

(Step ST1: Preparation of Substrate)

In step ST1, a substrate W is prepared in the internal space 10s of the chamber 10. The substrate W is placed on the substrate support 14 in the internal space 10s and secured by the electrostatic chuck 20. At least some of the process of forming each configuration on the substrate W may be performed in the internal space 10s. Also, after some or all of each configuration on the substrate W has been formed by an external apparatus or some other chamber in the substrate processing apparatus 1, the substrate W may be transported to the internal space 10s and placed on the substrate support 14.

Step ST1 may include the step of setting the temperature of the substrate support 14. In one example, the temperature of the substrate support 14 is set to 0° C. or lower. The temperature of the substrate support 14 may also be set to a temperature of −40° C. or lower. When the temperature of the substrate support 14 or the substrate W is set to such a temperature, the etching rate of the silicon-containing film SF is high in step ST2. The control unit 80 may control the chiller unit to set the temperature of the substrate support 14. As described later, when the processing gas includes phosphorus-containing molecules, the temperature of the substrate support 14 may be set to 20° C. or lower.

(Step ST2: Perform Etching)

In step ST2, the silicon-containing film SF on the substrate W is etched. Step ST2 includes a step of supplying processing gas (step ST21), a step of supplying radio-frequency power to the lower electrode 18 (step ST22), and a step of supplying a direct current voltage to the upper electrode 30 (step ST23). In step ST2, the silicon-containing film SF is etched by the active species (ions, radicals) of the plasma generated from the processing gas. The order in which steps ST21 to ST23 are started is not limited to the order mentioned here. Steps ST21 to ST23 may also be executed in parallel.

(Step ST21: Supply Processing Gas)

In step ST21, the processing gas is supplied into the chamber 10. The processing gas is a gas used to etch the film formed on the substrate W. The type of processing gas may be selected based on the material composition of the film to be etched, the material composition of the mask film, the material composition of the undercoat film, the pattern on the mask film, and the etching depth, etc.

The processing gas used in step ST21 may include a hydrogen- and fluorine-containing gas. The hydrogen- and fluorine-containing gas may be a gas that can produce a hydrogen fluoride (HF) species in the chamber 10 during plasma processing. Here, the hydrogen fluoride species serves as an etchant. The hydrogen- and fluorine-containing gas may be at least one gas selected from the group consisting of hydrogen fluoride (HF) and hydrofluorocarbons. The hydrofluorocarbon may be, for example, at least one of $CH_2F_2$, $CHF_3$, or $CH_3F$. The hydrofluorocarbon may contain two or more carbon atoms, or may contain two or more and six or fewer carbon atoms. The hydrofluorocarbon may contain two carbon atoms such as, for example, $C_2HF_5$, $C_2H_2F_4$, $C_2H_3F_3$ and $C_2H_4F_2$. The hydrofluorocarbon may contain three or four carbon atoms such as, for example, $C_3HF_7$, $C_3H_2F_2$, $C_3H_2F_4$, $C_3H_2F_6$, $C_3H_3F_5$, $C_4H_2F_6$, $C_4H_5F_5$, and $C_4H_2F_8$. The hydrofluorocarbon gas may contain five carbon atoms such as, for example, $C_5H_2F_6$, $C_5H_2F_{10}$, and $C_5H_3F_7$. In one embodiment, the hydrofluorocarbon gas is at least one selected from the group consisting of $C_3H_2F_4$, $C_3H_2F_6$, $C_4H_2F_6$, and $C_4H_2F_8$. The hydrogen- and fluorine-containing gas may be a mixed gas that can produce hydrogen fluoride species in the chamber 10 during plasma processing. A mixed gas that can produce hydrogen fluoride species may include a hydrogen source and a fluorine source. The hydrogen source may be, for example, $H_2$, $NH_3$, $H_2O$, $H_2O_2$ or a hydrocarbon ($CH_4$, $C_3H_6$, etc.). The fluorine source may be $NF_3$, $SF_6$, $WF_6$, $XeF_2$, a fluorocarbon, or a hydrofluorocarbon. A mixed gas that can produce hydrogen fluoride species may be, for example, a mixed gas of nitrogen trifluoride ($NF_3$) and hydrogen ($H_2$).

The processing gas used in step ST21 may also include at least one phosphorus-containing molecule. The phosphorus-containing molecule may be an oxide such as tetraphosphorus pentoxide ($P_4O_{10}$), tetraphosphorus octoxide ($P_4O_8$), or tetraphosphorus hexoxide ($P_4O_6$). Phosphorus pentoxide is also known as diphosphorus pentoxide ($P_2O_5$). The phosphorus-containing molecule may be phosphorus trifluoride ($PF_3$), phosphorus pentafluorofluorus ($PF_5$), phosphorus trichloride ($PCl_3$), phosphorus pentachloride ($PCl_5$), phosphorus tribromide ($PBr_3$), phosphorus pentabromite ($PBr_5$), or a halide (phosphorus halide) such as phosphorus iodide ($PI_3$). In other words, the phosphorus-containing molecule may be a fluoride containing fluorine as the halogen element (phosphorus fluorine). Alternatively, the phosphorus-containing molecule may be a halogen element other than fluorine as the halogen element. The phosphorus-containing molecule may be a halogenated phosphoryl such as phosphoryl fluoride ($POF_3$), phosphoryl chloride ($POCl_3$), or phosphoryl bromide ($POBr_3$). The phosphorus-containing molecule may also be, for example, phosphine ($PH_3$), a calcium phosphide ($Ca_3P_2$, etc.), phosphoric acid ($H_3PO_4$), sodium phosphate ($Na_3PO_4$), or hexafluorophosphoric acid ($HPF_6$). The phosphorus-containing molecule may be a fluorophosphine ($H_xPF_y$). Here, the sum of x and y is 3 or 5. Examples of fluorophosphines include $HPF_2$ and $H_2PF_3$. The processing gas may contain one or more phosphorus-containing molecules as the phosphorus-containing molecule. For example, the processing gas may contain at least one of $PF_3$, $PCl_3$, $PF_5$, $PCl_5$, $POCl_3$, $PH_3$, $PBr_3$, or $PBr_5$ as the phosphorus-containing molecule. When each phosphorus-containing molecule in the processing gas is a liquid or a solid, each phosphorus-containing molecule may be vaporized by applying heat and supplied to the chamber 10.

The processing gas used in step ST21 may also contain carbon. The carbon-containing molecule may be at least one carbon-containing gas selected from the group consisting of hydrocarbons ($C_xH_y$), fluorocarbons ($C_vF_w$), and hydrofluorocarbons ($C_sH_tF_u$). Here, each of x, y, s, t, u, v and w is a natural number. The hydrocarbons may include, for example, $CH_4$, $C_2H_6$, $C_3H_6$, $C_3H_8$, or $C_4H_{10}$. The fluorocarbons may include, for example, $CF_4$, $C_2F_2$, $C_2F_4$, $C_3F_8$, $C_4F_6$, $C_4F_8$, or $C_6F_8$. The chemical species produced from these carbon-containing gases protect the mask film MK.

The processing gas may also include halogen-containing molecules. The halogen-containing molecule does not have to contain carbon. The halogen-containing molecule may be a fluorine-containing molecule or may be a halogen-containing molecule containing a halogen element other than fluorine. The fluorine-containing molecule may contain, for example, a gas such as nitrogen trifluoride ($NF_3$), sulfur hexafluoride ($SF_6$), or boron trifluoride ($BF_3$). The halogen-containing molecule containing a halogen element other than fluorine may be at least one selected from the group consisting of, for example, chlorine-containing gases, bromine-containing gases, and iodine-containing gases. Chlorine-containing gases include, for example, chlorine ($Cl_2$), silicon dichloride ($SiCl_2$), silicon tetrachloride ($SiCl_4$), carbon tetrachloride ($CCl_4$), dicyclolosilane ($SiH_2Cl_2$), disilicon hexachloride ($Si_2Cl_6$), chloroform ($CHCl_3$), sulfuryl chloride ($SO_2Cl_2$), and boron trichloride ($BCl_3$). Bromine-containing gases include, for example, bromine ($Br_2$), hydrogen bromide (HBr), dibromodifluoromethane ($CBr_2F_2$), bromopentafluoroethane ($C_2F_5Br$), phosphorus tribromide ($PBr_3$), phosphorus pentabromide ($PBr_6$), phosphorus oxybromide ($POBr_3$), and boron tribromide ($BBr_3$). Iodine-containing gases include, for example, hydrogen iodide (HI), trifluoroiodomethane ($CF_3I$), pentafluoroiodoethane ($C_2F_5I$), heptafluoropropyl iodide ($C_3F_7I$), iodine pentafluoride ($IF_5$), iodine heptafluoride ($IF_7$), iodine ($I_2$), and phosphorus triiodide ($PI_3$). The chemical species produced from these halogen-containing molecules are used to control the shape of the recesses formed by plasma etching.

The processing gas may also include oxygen-containing molecules. The oxygen-containing molecules may include, for example, $O_2$, $CO_2$, or CO. Alternatively, the processing gas does not have to contain oxygen. The processing gas may also contain noble gases such as Ar, Kr, and Xe.

(Step ST22: Supply Radio-frequency Power)

In step ST22, radio-frequency power HF is supplied to the lower electrode 18. As shown in FIG. 4, the radio-frequency power HF has power level H2 in the fourth period and power level L2, which is lower than power level H2, in the third period. In the third period shown in FIG. 4, the power level of the radio-frequency power HF may be zero.

The frequency at which electric pulses of radio-frequency power HF are periodically generated (that is, during the fourth period when the power level is H2) may be, for example, 2 kHz or more and 8 kHz or less. The radio-frequency constituting the electric pulses has, for example, a frequency of 27 MHz or more and 100 MHz or less. The duty ratio of the electric pulses in the radio-frequency power HF, that is, the ratio of the fourth period in each cycle of the radio-frequency power HF (which is the period obtained by adding the third period to the fourth period) may be, for example, 1% or more and 90% or less. The duty ratio may be 20% or more and 80% or less.

In step ST22, a second electrical bias may be supplied to the lower electrode 18. In one example, the second electrical bias is direct current voltage having a negative polarity. The second electrical bias may also be radio-frequency power LF. The second electrical bias may be supplied to the substrate support 14 at the same time radio-frequency power HF is supplied to the substrate support 14. In one example, the electric pulses of the second electrical bias are supplied to the substrate support 14 on the same timing as the power pulses of radio-frequency power HF (that is, during the sixth period when the voltage level is H3). The electric pulses of the second electrical bias may be supplied to the substrate support 14 on a timing different from that of the power pulses of radio-frequency power HF. At least some of the fourth period and the sixth period may overlap temporally.

The frequency at which the electric pulses of the second electrical bias are periodically generated may be, for example, 2 kHz or more and 8 kHz or less. Also, the radio-frequency constituting the electric pulses has, for example, a frequency of 400 kHz or more and 13.56 MHz or less. The duty ratio of the electric pulses in the second electrical bias, that is, the ratio of the sixth period in each cycle of the second electrical bias (which is the period obtained by adding the fifth period to the sixth period) may be, for example, 1% or more and 90% or less. The duty ratio may be 20% or more and 80% or less. The duty ratio of the electric pulses for the second electrical bias (sixth period) may be different from the duty ratio of the electric pulses for the radio-frequency power HF (fourth period). In another embodiment, the radio-frequency power LF may be supplied to the substrate support 14 instead of the second electrical bias.

Figure 5:
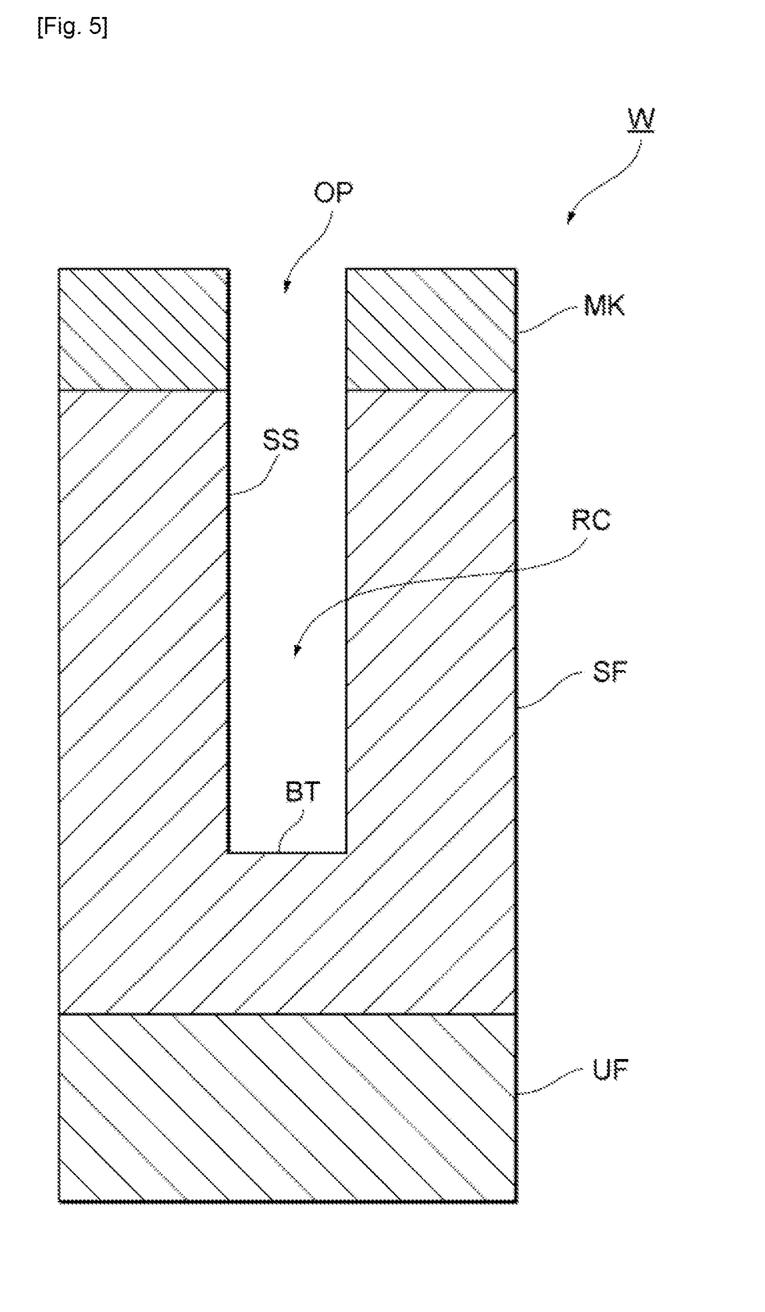
FIG. 5 is a figure showing an example of the cross-sectional structure of the substrate W in step ST22.

FIG. 5 is a figure showing an example of the cross-sectional structure of the substrate W in step ST22. In step ST22, when the radio-frequency power HF and the second electrical bias are supplied to the lower electrode 18, a radio-frequency electric field is generated between the upper electrode 30 and the substrate support 14. As a result, plasma is generated from the processing gas supplied to the internal space 10s. Chemical species in the generated plasma such as ions and radicals are attracted to the substrate W, and the silicon-containing film SF is etched on the substrate W. Then, as shown in FIG. 5, a recess RC defined by the side walls of the silicon-containing film SF is formed even in the silicon-containing film SF continuously from the opening OP formed in the mask film MK based on the shape of the opening OP in the mask film MK. The recess RC may be an opening in the bottom portion BT in which the undercoat UF is exposed.

(Step ST23: Apply First Electrical Bias)

In step ST23, a first electrical bias is applied to the top electrode 30 (see FIG. 3). The voltage of the first electrical bias may be controlled based on the timing at which electric pulses of radio-frequency power HF are supplied to the substrate support 14. In one example, the voltage level of the first electrical bias in the second period may range from −100 volts to −500 volts. Also, in an example, the voltage level of the first electrical bias in the first period may be in the range of −500 volts to −1200 volts. In another embodiment, a low-frequency RF signal may be supplied to the upper electrode 30 instead of the first electrical bias.

The first electrical bias may be supplied to the substrate support 14 on the same timing used to supply the radio-frequency power HF to the substrate support 14. In one example, the electrical pulses of the first electrical bias may be supplied to the substrate support 14 on the same timing as the third period for the radio-frequency power HF (that is, the second period when the voltage level is H1). Also, the electric pulses of the first electrical bias may be supplied to the substrate support 14 on a timing different from the third period for the radio-frequency power HF. At least some the second period and the third period may overlap temporally.

The duty ratio of the second period for the first electrical bias, that is, the ratio of the second period in each cycle of the first electrical bias (a period obtained by adding the first period to the second period) may be, for example, 1% or more and 90% or less. The duty ratio may be 20% or more and 80% or less. Also, the duty ratio of the second period for the first electrical bias may be the same as or different from the duty ratio of the third period for the radio-frequency power HF.

First Example

Figure 6:
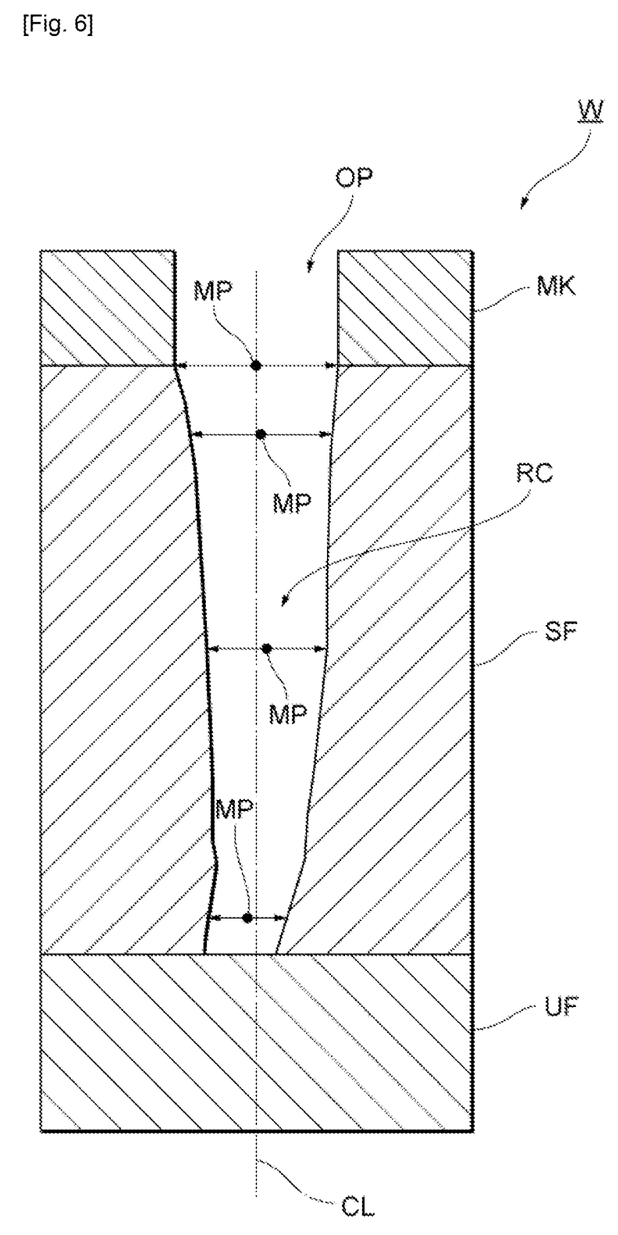
FIG. 6 is a figure used to explain an example of the method used to evaluate the cross-sectional profile of a recess RC.

FIG. 6 is a figure used to explain an example of the method used to evaluate the cross-sectional profile of a recess. In FIG. 6, the central reference line CL is a line passing through the midpoint MP of the width of the recess RC on the lower surface of the mask film MK or the upper surface of the silicon-containing film SF. The shape of the opening OP can be evaluated by measuring the amount of deviation of the midpoint MP from the center reference line CL in the depth direction of the recess RC. For example, the twists and turns of the recess RC formed in the silicon-containing film SF can be evaluated based on the amount of deviation.

In Example 1 and Reference Example 1, the silicon-containing film SF on a substrate W was etched under the following conditions. In both Example 1 and Reference Example 1, a mixed gas of $Cl_2$, HBr, $NF_3$, $CH_2F_2$, HF and $PF_3$ was supplied as the processing gas to the internal space 10s in the substrate processing apparatus 1. Radio-frequency power HF with a radio-frequency of 40 MHz at 5500 W and second electrical bias with a pulse voltage of 400 kHz at 6000 V were supplied to the lower electrode 18, and plasma was generated from the mixed gas for 20 minutes to etch the silicon-containing film SF on the substrate W. The temperature of the substrate support 14 at this time was set to −70° C. In both Example 1 and Reference Example 1, the duty ratio in the fourth period shown in FIG. 4 was set to 80%. In Example 1, the voltage level in the first period of the first electrical bias was set to −150 volts, and the voltage level in the second period was set to −1000 volts. Meanwhile, in Reference Example 1, the voltage level of the first electrical bias was set to −150 volts in both the first and second periods.

Figure 7:
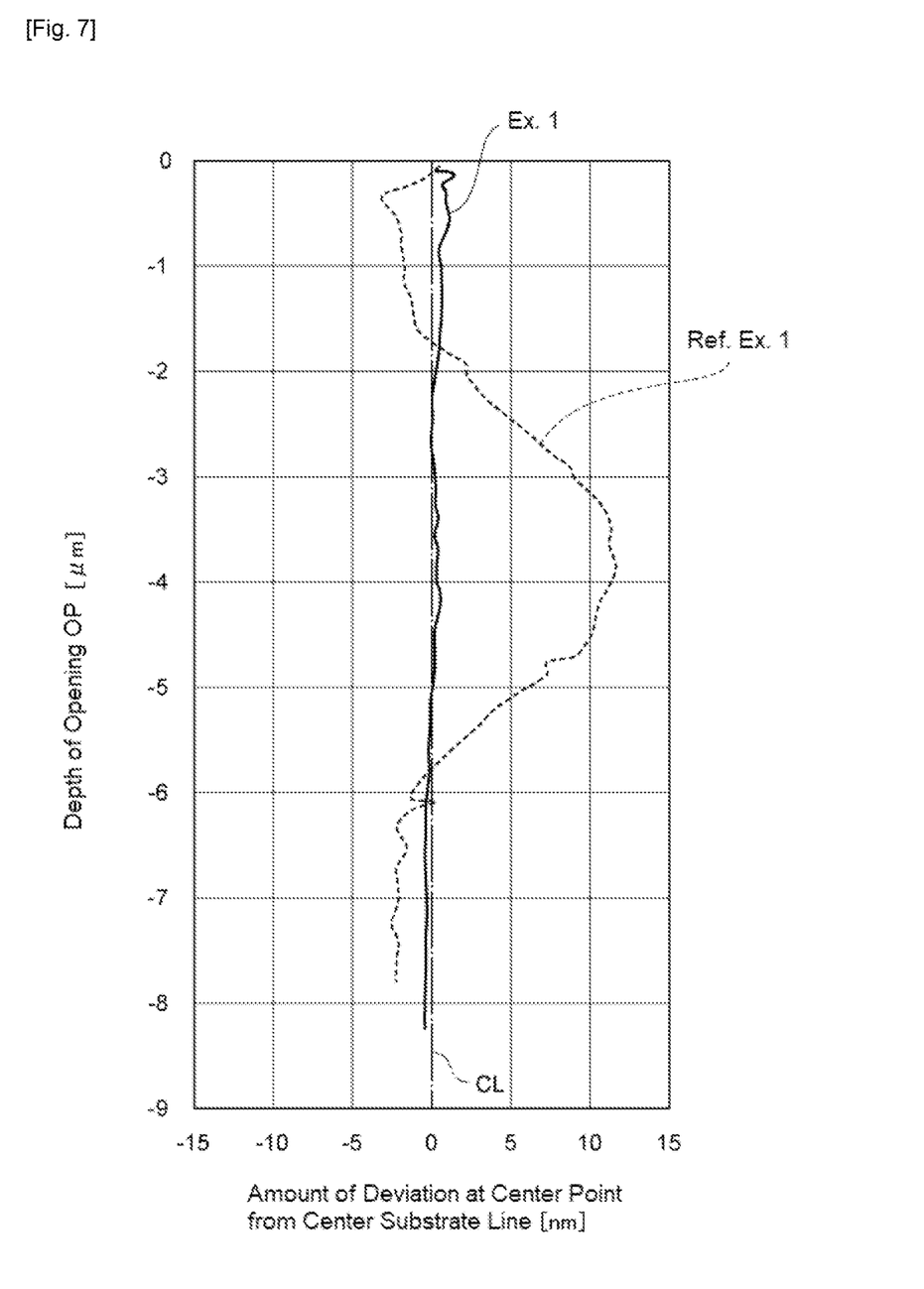
FIG. 7 is a graph showing the amount of deviation in Example 1 and Reference Example 1.

FIG. 7 is a graph showing the amount of deviation from the center reference line CL of the midpoint MP of the width of the recess RC obtained by etching the silicon-containing film SF in Example 1 and the amount of deviation from the center reference line CL of the midpoint MP of the width of the recess RC obtained by etching the silicon-containing film SF in Reference Example 1. In FIG. 7, the vertical axis indicates the depth of the recess RC of the silicon-containing film SF. The horizontal axis indicates the amount of deviation from the center reference line CL of the midpoint MP of the width of the recess RC. As indicated by the solid line in FIG. 7, hardly any deviation of the midpoint MP from the center reference line CL was observed in Example 1. However, as indicated by the dashed line in FIG. 7, the midpoint MP deviated significantly from the center reference line CL and the cross-sectional profile of the recess RC twisted and turned significantly, especially at a depth of about 2 μm to about 6 μm, in Reference Example 1.

Second Example

In Example 2 and Reference Example 2, the silicon-containing film SF on the substrate W was etched at a $PF_3$ flow rate that was 1.5 times that of the conditions in Example 1 and Reference Example 1. In Example 2, as in Example 1, a recess RC with hardly any twisting and turning was obtained after etching for 20 minutes. However, in Reference Example 2, the etching process was stopped approximately 7 minutes and 30 seconds after the start of etching due to the impact of the deposits generated around the bottom portion BT of the recess RC in the silicon-containing film SF (see FIG. 5).

In the present embodiment, when, for example, in the fourth period, the active species generated in the plasma were attracted to the substrate W and the silicon-containing film SF was etched, the etched portion of the substrate W (for example, the side walls SS and the bottom portion BT of the recess RC formed in the silicon-containing film SF) sometimes becomes positively charged. When the side walls SS and the bottom portion BT of the recess RC are asymmetrically charged and the active species generated in the plasma reach the recess RC, the traveling direction of the active species may be affected by the charge. However, when, for example, in the third period, electric pulses of the first electrical bias are applied to the upper electrode 30, positive ions present in the plasma are attracted to the upper electrode 30 and collide with the upper electrode 30. When positive ions collides with the upper electrode 30, secondary electrons are emitted from the upper electrode. The emitted secondary electrons are accelerated by the upper electrode 30 which has a negative potential and reach the substrate W. The secondary electrons that reach the substrate W then eliminate or reduce the charge of the positively charged portion of the substrate W (for example, the bottom BT of the recess RC formed in the silicon-containing film SF). In other words, in the present embodiment, the charge of the side walls SS and the bottom portion BT of the recess RC generated in the fourth period can be eliminated or reduced in the second period. Therefore, when the active species generated in the plasma reach the recess RC, the impact of the charge on the traveling direction of the active species can be eliminated.

In the present embodiment, the composition of the active species generated in the plasma can be controlled by supplying an electrical pulse at the second electrical bias to the upper electrode 30 in the second period. This makes it possible to control the formation of deposits during etching of the silicon-containing film SF. As a result, the adverse effects of deposits on the etching process during etching can be eliminated or reduced.

In an exemplary embodiment of the present disclosure, a technique can be provided for controlling the shape of a recess formed by plasma etching.

The embodiments described above are provided for explanatory purposes and should not be interpreted as limiting the scope of the present disclosure. Various modifications of these embodiments are possible without departing from the scope and spirit of the present disclosure.

The invention claimed is:

1. A substrate processing method for processing a substrate with a plasma processing apparatus, the plasma processing apparatus including a chamber, a substrate support disposed in the chamber, and an upper electrode disposed in the chamber facing the substrate support, the substrate processing method comprising:
   providing a substrate having a silicon-containing dielectric film on the substrate support; and
   generating plasma from a processing gas including a hydrogen fluoride gas to etch the silicon-containing dielectric film,
   wherein the etching comprises:
      supplying the processing gas into the chamber,
      supplying a first radio-frequency signal for generating the plasma to the substrate support or the upper electrode; and
      supplying a first electrical bias to the upper electrode.

2. The substrate processing method according to claim 1, wherein the first electrical bias is direct current voltage or a second radio-frequency signal, frequency of the second radio-frequency signal being lower than frequency of the first radio-frequency signal.

3. The substrate processing method according to claim 1, wherein the first electrical bias is negative direct current voltage.

4. The substrate processing method according to claim 1, wherein the first electrical bias is a continuous wave.

5. The substrate processing method according to claim 1, wherein the first electrical bias is supplied to the upper electrode during at least one of a first period and a second period alternating with the first period,
   an absolute value of voltage of the first electrical bias in the first period is 0 or a first voltage value, and
   the absolute value of the voltage of the first electrical bias in the second period is a second voltage value greater than the first voltage value.

6. The substrate processing method according to claim 5, wherein the first radio-frequency signal is supplied in a third period and a fourth period alternating with the third period,
   an absolute value of the voltage in the third period is 0 or a third voltage value,
   an absolute value of the voltage in the fourth period is a second voltage value greater than the third voltage value, and
   the second period and the third period overlap at least partially.

7. The substrate processing method according to claim 5, wherein proportion of the second period relative to a total of the first period and the second period is 20% or more and 80% or less.

8. The substrate processing method according to claim 5, wherein a frequency that defines the period of the second period relative to the first period and the second period is 2 kHz or more and 8 kHz or less.

9. The substrate processing method according to claim 1, wherein the etching further comprises supplying a second electrical bias to the substrate support.

10. The substrate processing method according to claim 1, wherein the processing gas also includes at least one carbon-containing gas selected from the group consisting of fluorocarbon gases and hydrofluorocarbon gases.

11. The substrate processing method according to claim 1, wherein the silicon-containing dielectric film includes at least one selected from the group consisting of a silicon oxide film, a silicon nitride film, and a polycrystalline silicon film.

12. The substrate processing method according to claim 1, wherein the first electrical bias is a pulse wave.

13. A substrate processing method for processing a substrate with a plasma processing apparatus, the plasma processing apparatus including a chamber, a substrate support disposed in the chamber, and an upper electrode disposed in the chamber facing the substrate support, the substrate processing method comprising:
   providing a substrate having a silicon-containing dielectric film on the substrate support; and generating plasma from a processing gas including a hydrogen- and fluorine-containing gas to etch the silicon-containing dielectric film, wherein the etching comprises:

supplying the processing gas into the chamber, supplying a first radio-frequency signal for generating the plasma to the substrate support or the upper electrode, and supplying a first electrical bias to the upper electrode, and wherein the processing gas also includes a phosphorus-containing gas.

14. The substrate processing method according to claim 13, wherein the phosphorus-containing gas includes a phosphorus halide.

15. The substrate processing method according to claim 14, wherein the phosphorus halide is phosphorus fluoride.

\* \* \* \* \*